(12) United States Patent
Sowlati (10) Patent No.: US 6,515,547 B2
(45) Date of Patent: Feb. 4, 2003

(54) SELF-BIASED CASCODE RF POWER AMPLIFIER IN SUB-MICRON TECHNICAL FIELD

(75) Inventor: Tirdad Sowlati, Ossining, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/891,669

(22) Filed: Jun. 26, 2001

(65) Prior Publication Data

US 2002/0196086 A1 Dec. 26, 2002

(51) Int. Cl.$^7$ .................................................. H03F 1/22
(52) U.S. Cl. ........................................ 330/311; 330/277
(58) Field of Search ................................ 330/253, 277, 330/298, 302, 311

(56) References Cited

U.S. PATENT DOCUMENTS 5,032,799 A * 7/1991 Milberger et al. ........... 330/311
5,559,472 A * 9/1996 Kobayashi ................... 330/311
6,137,367 A * 10/2000 Ezzedine et al. ............. 330/311

OTHER PUBLICATIONS

US 000260, U.S. Ser. No. 09/671,911, Filed: Sep. 28, 2000.
US 000265, U.S. Ser. No. 09/671,890, Filed: Sep. 28, 2000.

* cited by examiner

Primary Examiner—Robert Pascal
Assistant Examiner—Khanh Van Nguyen
(74) Attorney, Agent, or Firm—Steven R. Biren (57) ABSTRACT

A method for increasing the maximum useable supply voltage in an amplifier circuit is presented. A self-biased cascode amplifier circuit includes a first MOSFET and a second MOSFET connected in series and coupled between a DC voltage source terminal and a common terminal. An RF input signal terminal is coupled to a gate electrode of the first MOSFET, and the gate of the second MOSFET is connected between a resistor and a capacitor connected in series between the drain of the second MOSFET and the source of the first MOSFET. In preferred embodiments a unidirectionally-conducting boosting sub-circuit is coupled between a drain electrode and the gate electrode of the second MOSFET, which may comprise a diode-resistive sub-circuit, or a third MOSFET connected across a resistive voltage divider. The output of the amplifier circuit is taken from the drain electrode of the second MOSFET. These configuration permits the first and second MOSFETs to withstand a larger output voltage swing, thus permitting the use of a higher supply voltage and increased output power, without the necessity of complex biasing voltages.

10 Claims, 7 Drawing Sheets

SELF-BIASED CASCODE RF POWER AMPLIFIER IN SUB-MICRON TECHNICAL FIELD

TECHNICAL FIELD

The present invention relates to power amplifiers, and more specifically, to an improved configuration for power amplifiers suitable for use in high-frequency applications.

BACKGROUND OF THE INVENTION

In state of the art MOS power amplifiers, the drain-gate voltage can often go as high as three times the supply voltage. This poses a limitation on the maximum supply voltage that can be used in such amplifiers and still avoid gate-drain breakdown. One method of ameliorating this problem is to utilize the familiar cascode structure in the amplifier, in which, in a two-transistor example, one transistor is in the common-source configuration and another is in the common gate configuration. In such cascode configuration the signal swing drops between the two transistors and therefore lessens the gate to drain breakdown problem. Such cascode transistors appear as a four terminal device: two gates, one source and one drain. Examples of such use of a cascode configuration are found in two pending applications recently filed (in 2000) by the present applicant, Tirdad Sowlati, entitled "CASCODE BOOTSTRAPPED ANALOG POWER AMPLIFIER CIRCUIT", and "BOOTSTRAPPED DUAL-GATE CLASS E AMPLIFIER CIRCUIT", respectively, the disclosures of each of which are incorporated herein by this reference as if fully set forth.

The cascode configuration thus requires two DC voltages, one for each of the gates. These DC voltages must be applied from sources external to the chip, therefore requiring an extra bond pad for the second gate, or alternatively, they must be generated on the chip requiring extra biasing circuitry.

A further condition in power amplifier applications is that it is very desirable to have the DC value which is applied to second gate to be equal to the supply voltage, thereby allowing a larger voltage swing on the drain. Thus, the second gate must have a DC connection to an off chip DC voltage source.

Thus, while the cascode configuration does ameliorate the gate-drain breakdown problem, it increases cost and complexity of the power amplifier. What would be a better solution is the ability to utilize the cascode configuration without the necessity of an additional DC voltage source for the gate of the second transistor. When more than one amplification stage is utilized, and/or differential amplifier structures are used, the resultant numerous cascode configurations multiply the DC voltage source problem.

In view of the above there exists a need in the art for an improved power amplifier configuration which has the stability provided by the cascode structure and yet does not require the extra DC connections needed to bias the two transistor gates for the standard cascode structure.

It is thus an object of the present invention to provide a power amplifier configuration that benefits from the unconditional stability provided by cascode structures, and yet at the same time does not require additional DC voltages supplied from off chip, or from extra biasing circuitry, to provide an additional DC biasing voltage on chip.

SUMMARY OF THE INVENTION

The above and other problems of the prior art are overcome in accordance with the present invention. A power amplifier is provided utilizing a self-biased cascode configuration, where the gate voltage of the common gate transistor of the cascode configuration is derived from its own drain. The self-biased cascode transistor appears as a compound transistor with three terminals and thus requires only DC voltage for the first gate (i.e. for the gate of the common source transistor). Due to the self biasing, the voltage of the second gate of the cascode pair is dynamically increased as its drain voltage is increased. The amount of increase can be chosen by appropriate selection of component values.

In such self-biased cascode amplifiers the combined transistors can withstand the larger voltage swing, thereby allowing the amplifier to be designed using a higher supply voltage with an increased output power. In preferred embodiments, the gate voltage of the second transistor of the self biased cascode structure is further boosted during the positive swing to more closely follow the rise in the drain voltage, to further achieve large signal swing with no gate-drain breakdown.

In an additional set of preferred embodiments the self-biased cascode amplifier configurations are expanded to differential structures and multi-stage differential power amplifiers. The amplifiers using the structure and method of the present invention can be designed in any of the standard classes of amplification, i.e. classes, A, B, C, and even switching class E.

These and other aspects of the invention will be apparent from, and elucidated with reference to, the embodiments described hereinafter.

BRIEF DESCRIPTION OF THE DRAWINGS

The present invention may be more clearly understood with reference to the following description, to be read in conjunction with the accompanying drawings.

DETAILED DESCRIPTION OF THE DRAWINGS

Figure 1:
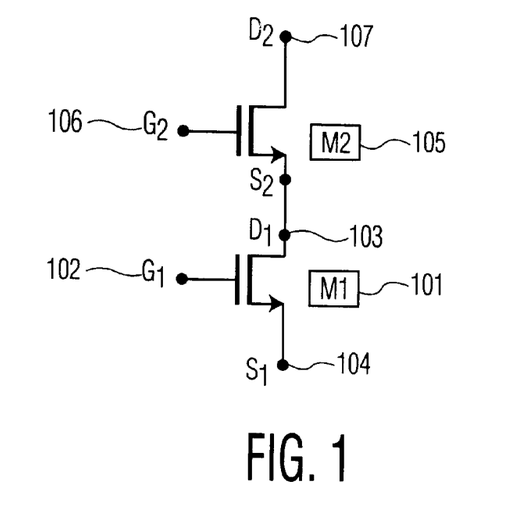
FIG. 1 depicts a standard cascode configuration of two MOS transistors.

A standard cascode configuration of two transistors is shown in FIG. 1. With reference thereto, transistor M1 101 is a common source, and M2 105 is a common gate. At point 103 the drain of M1 101 and the source of M2 105 are tied together. For ease of discussion, in what follows the letters D, S, and G shall refer to the drain, source and gate of a given transistor, such that, for example, G2 is the drain of a transistor M2, D1 is the drain of a transistor M1, etc.

Figure 2:
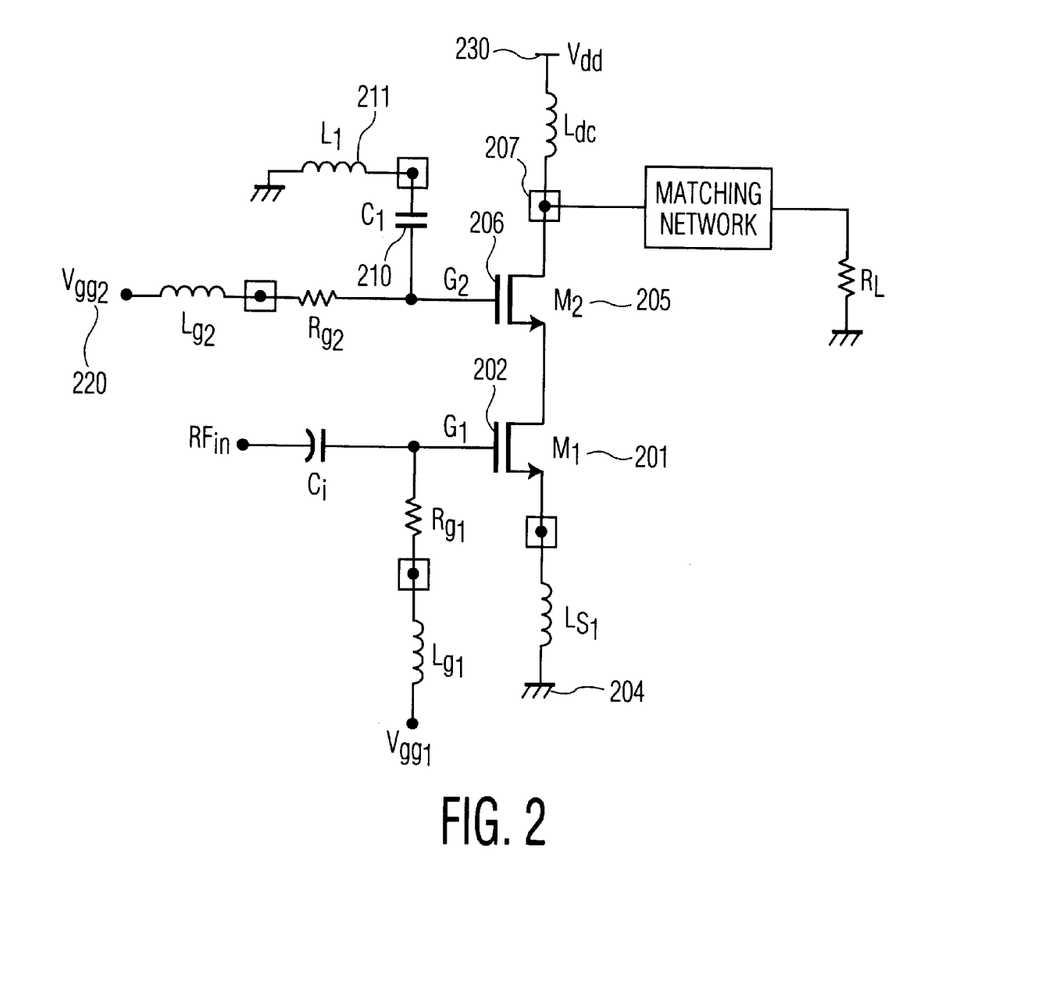
FIG. 2 depicts a conventional cascode configuration amplifier.

A conventional cascode amplifier is shown in FIG. 2. Transistor M1 201 acts as a common-source (CS) and transistor M2 205 acts as a common gate (CG). The RF input signal 210 is applied to the gate of M1 201, i.e. G1 202, and the gate of M2 205, i.e. G2 206, is at RF ground by virtue of being coupled to ground through L1 211 and C1 210, with a DC value equal to Vgg2 220 which can be equal to Vdd 230. The RF ground at G2 206 can be achieved by either an off-chip capacitor or an on-chip capacitor which resonates with the bondwire inductance. The conventional approach of providing RF ground at G2 206 is not necessary in the large signal regime of power amplifiers. Thus, the voltage at G2 206 can have RF swing, and as long as D2 207 has a full swing a from Vdd to zero, the power amplifier can provide a high output power and a high power-added-efficiency.

Figure 3A:
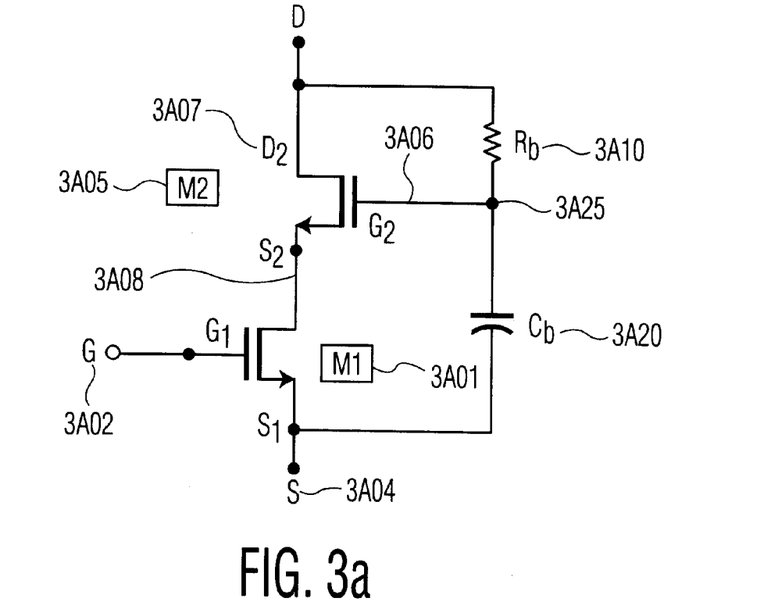
FIG. 3A depicts a self-biased cascode configuration of the two transistors depicted in FIG. 1.

FIG. 3a shows a self-biased cascode configuration. The bias for G2 3A06 is provided by the series connection of Rb 3A10 and Cb 3A20. The point between Rb and Cb, labeled as 3A25, is where G2 3A06 is tied. The DC voltage applied to G2 3A06 is thus the same as the DC voltage applied to D2 3A07 (at DC Cb is an open circuit, Rb has no current and thus no voltage drop, and all the voltage at D2 3A07 appears across Cb). The RF swing at D2 3A07 is thus attenuated by the low pass nature of the Rb–Cb 3A10–3A20 series connection. In power amplifier applications, it is desirable to have RF swing at G2. This enables having a larger signal swing at D2 without facing the breakdown voltage at G2-D2 3A06-3A07. As D2 3A07 increases, G2 3A06 also increases (with a smaller value, as set by Rb–Cb) and so does S2 3A08. In this way, the amount of voltage drop on each gate-drain in M1 and M2 can be balanced. The values of Rb and Cb can be chosen for optimum performance and signal swing before gate-drain breakdown occurs in either M1 or M2.

Such self-biased cascode configuration can also be viewed as a compound of transistor with one gate, one drain and one source. As is obvious, it does not require any additional bondpad to provide a supply voltage to G2.

It is noted that in the circuit of FIG. 3a, G2 follows the RF voltage of D2 in both the positive and negative swings about its DC value. Improving upon this fact, in FIG. 3b means have been added so that the positive swing of G2 will be larger than the negative swing. These means are the series connection of Rd 3B30, and diode connected M3 3B50, connected across Rb 3B10, and thus providing a parallel path from D2 3B07 to G2 3B06.

Figure 3B:
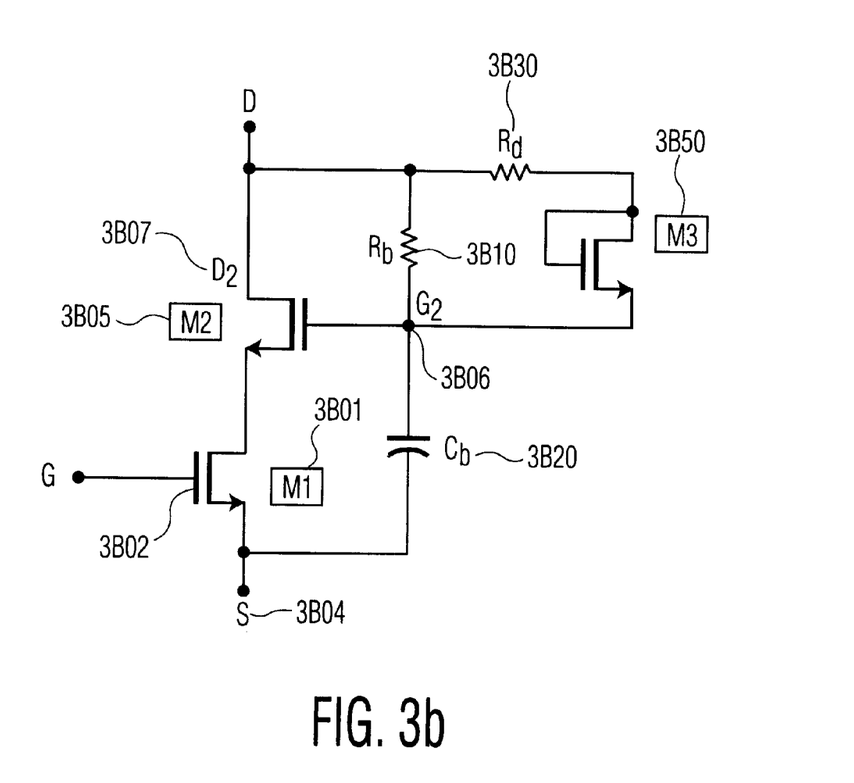
FIG. 3B depicts a self-biased cascode configuration with resistive diode boosting.

FIG. 3b is thus a self-biased cascode configuration with resistive-diode boosting. By appropriately choosing the value of Rd and the size of the diode connected transistor M3, the threshold voltage can be specified at which the Rd-M3 path starts conducting and boosting the positive swing of G2. This extra path enables G2 to follow the rise in D2 with a smaller attenuation than that with which it follows the fall in D2. This is especially of interest when the signal swing at D2 gets large in certain power amplifier designs. Again by choosing appropriate values for Rb 3B10, Cb 3B20, Rd 3B30, and M3 3B50, the best performance with largest signal swing without gate-drain breakdown voltage can be achieved.

Figure 3C:
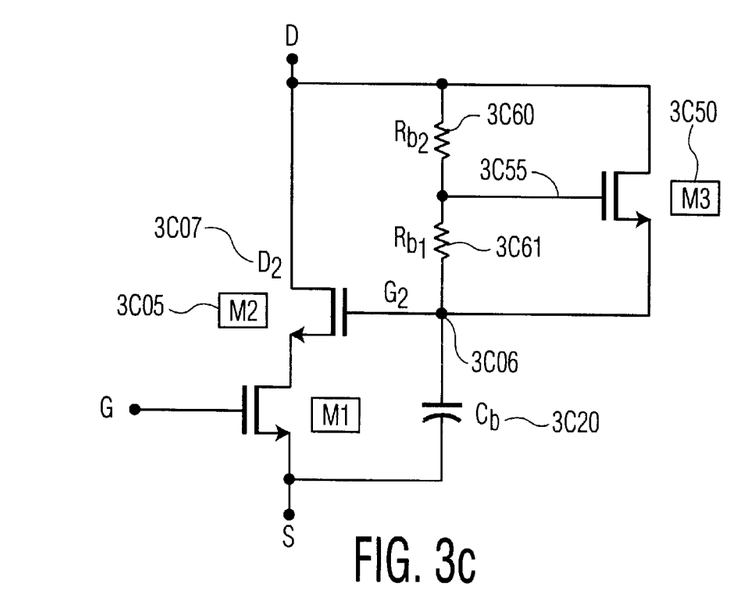
FIG. 3C depicts a self-biased cascode configuration with transistor boosting.

FIG. 3c is a similar circuit to that of FIG. 3B, except the series connection of Rd 3B30 and diode connected transistor 3B50 of FIG. 3B is replaced in the circuit of FIG. 3C with a regular MOSFET M3 3C50, whose gate is connected between two resistors Rb1 3C61 and Rb2 3C60, which replace the Rb 3B10 of FIG. 3B. The circuit of FIG. 3C is thus a self-biased cascode configuration with transistor boosting. In said circuit, the ratio of Rb1 3C61 to Rb2 3C60 sets the threshold for the voltage swing at D2 3C07 when transistor M3 3C50 starts conducting and boosting the positive signal swing at G2 3C06. IN a similar fashion to the circuit depicted in FIG. 3b, in FIG. 3c the dimensions of Rb1 3C61, Rb2 3C60, Cb 3C20 and M3 3C50 can be chosen in a given circuit or application so as to achieve best large signal swing performance without having any gate-drain breakdown voltage. The circuit of FIG. 3c has a larger boosting capability than that of FIG. 3b, due to the fact that because of the resistive division of Rb1–Rb2 3C61–3C60, transistor M3 3C50 will not experience any gate-drain breakdown before transistor M2 3C05. Therefore, it will limit the signal swing even less, as compared to the resistive-diode boosting of the circuit of FIG. 3b.

Figure 4A:
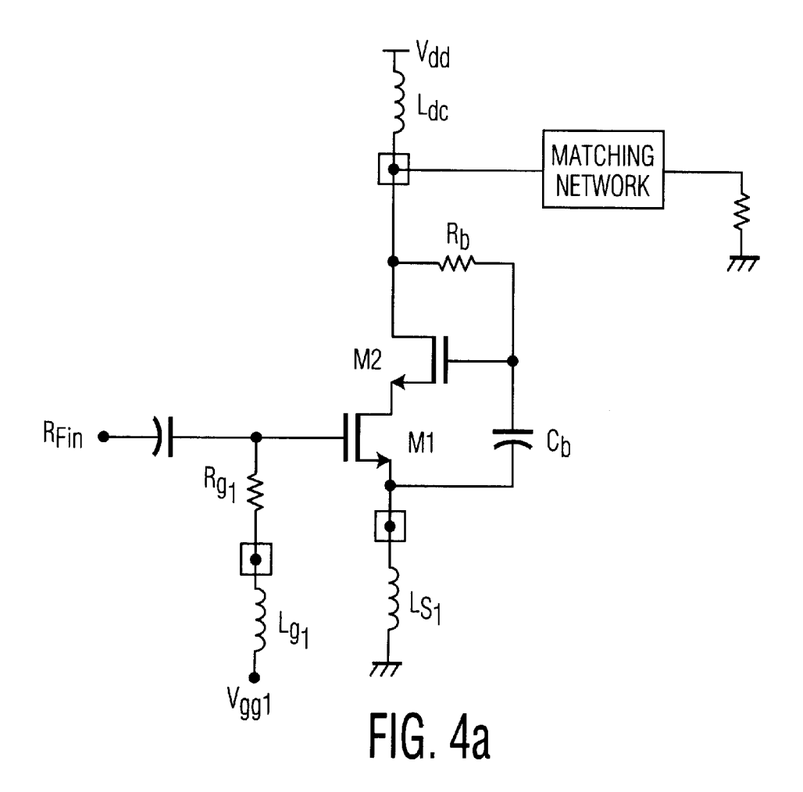
FIGS. 4A and 4B depict self-biased cascode amplifiers corresponding to the transistor configurations of FIGS. 3A and 3C respectively.
Figure 4B:
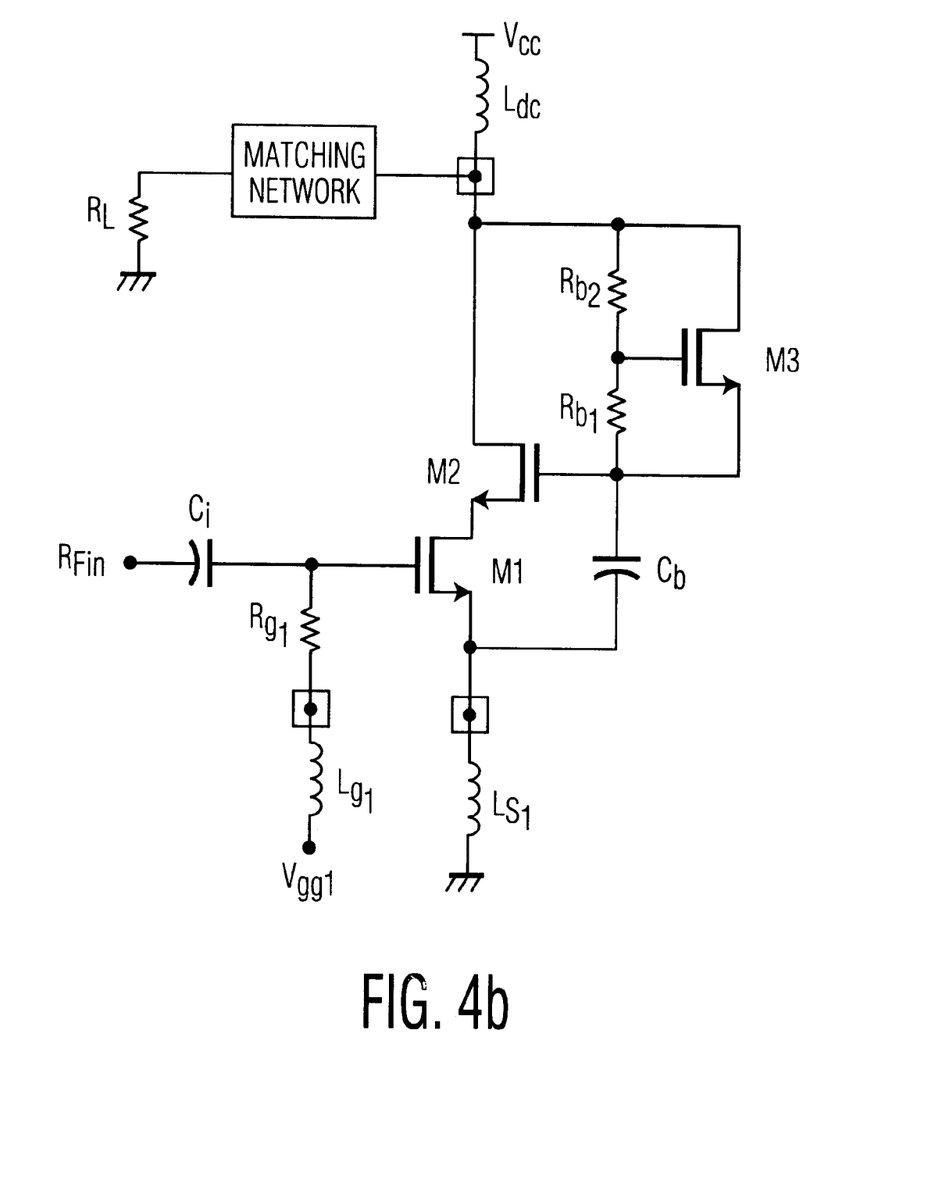

FIGS. 4a and 4b depict self-biased cascode amplifiers corresponding to FIG. 3a and FIG. 3c with exemplary loads and biasing provided. (A similar amplifier corresponding to the circuit of FIG. 3b—the resistive-diode boosting case—can be realized which has not been depicted for brevity). All these configurations allow the user to control the maximum drain-gate voltage of both M2 and M1 in each case.

Figure 5A:
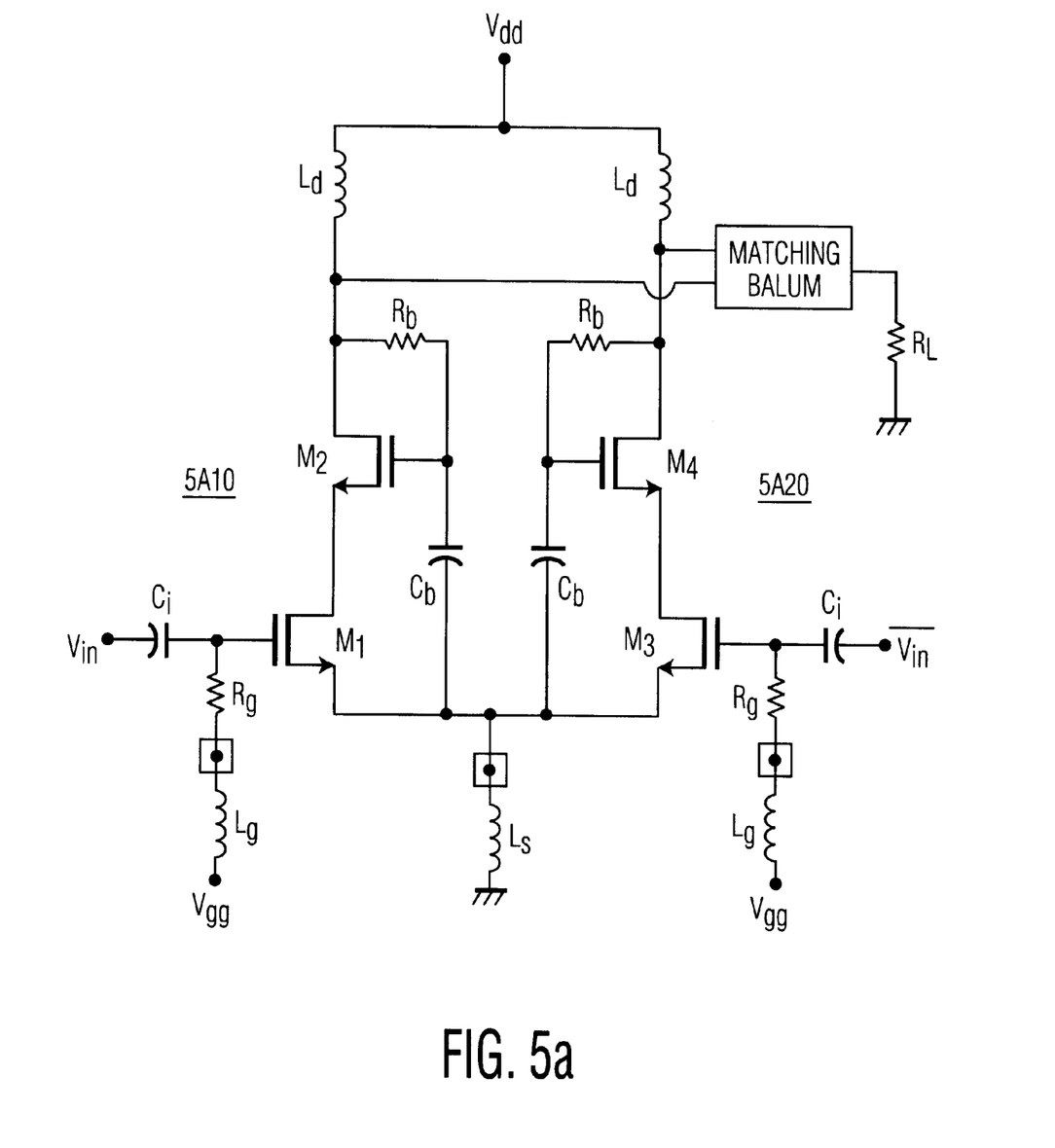
FIG. 5A depicts a differential self-biased cascode amplifier according to the present invention.
Figure 5B:
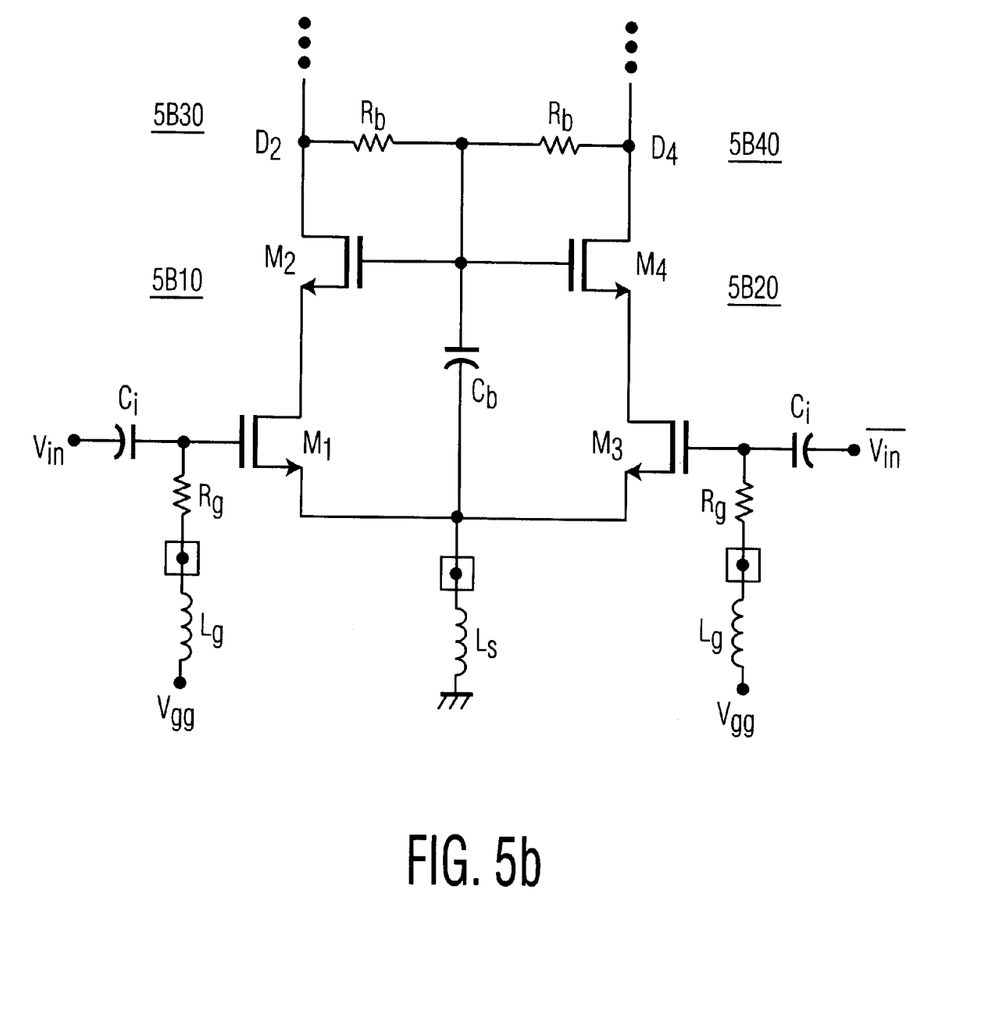
FIG. 5B depicts the circuit of FIG. 5A where the gates of transistors M2 and M4 have been tied together.

FIG. 5a embodies the concepts of the present invention in a more complex configuration, and thus depicts a differential self-biased cascode amplifier. It should be pointed out that the gates of M2 5A10, 5B10 and M4 5A20, 5B20 can be connected together as shown in FIG. 5b. In this case, because of the differential nature of signal swing at D2 5B30 and D4 5B40, the gates will have much less RF swing. In power amplifiers this limits the maximum signal swing at D2 (D4) 5B30 (5B40) due to gate-drain breakdown. Thus the circuit of FIG. 5a is generally a better choice than that of FIG. 5b.

Figure 6:
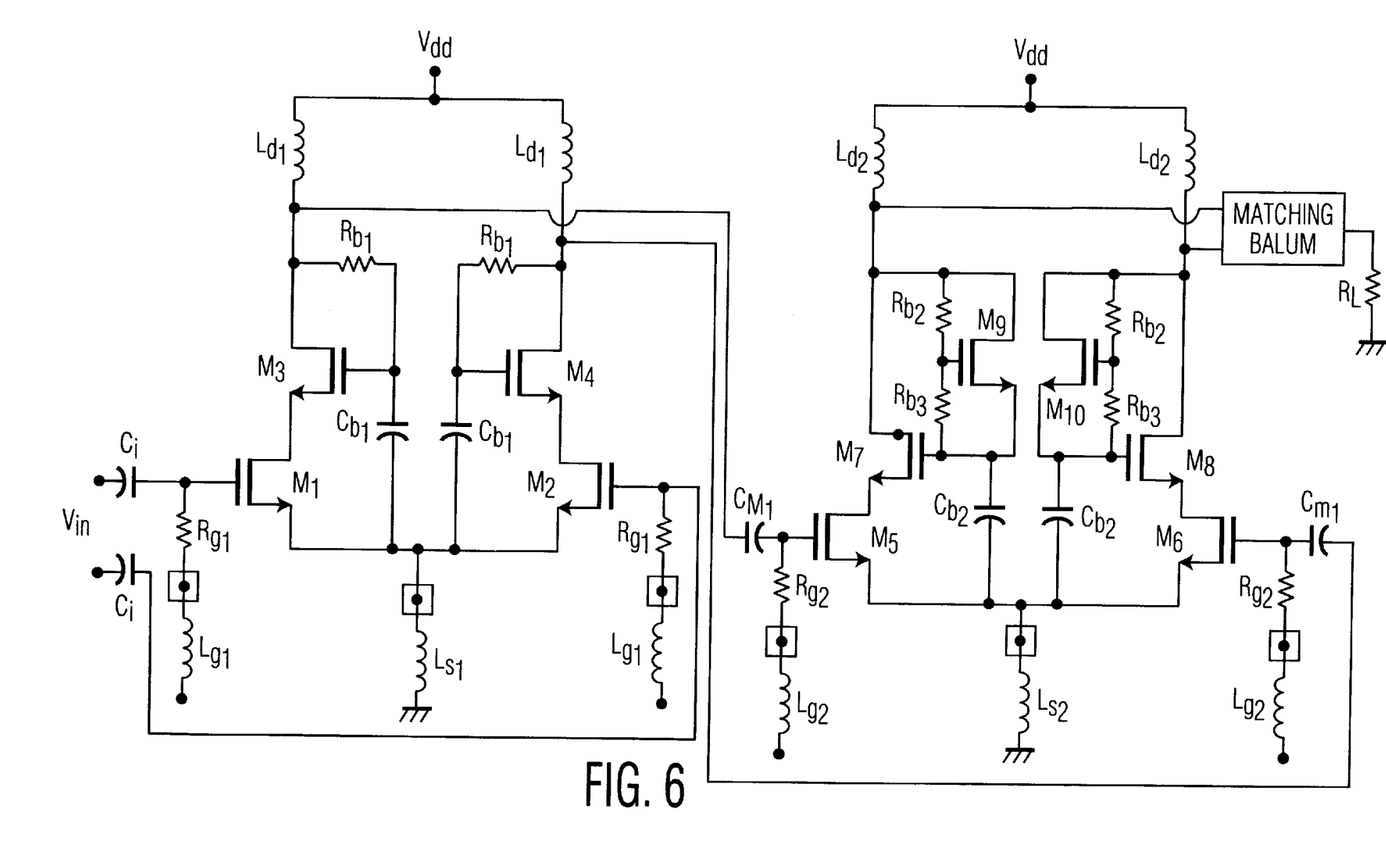
FIG. 6 depicts a two stage differential amplifier according to the present invention.

FIG. 6 presents a two-stage differential amplifier embodiment. The first stage uses a self-biased cascode amplifier with no unidirectional boosting, thus corresponding to the circuits of FIGS. 3a, 4a, and 5a. In the second stage, the signal swing is larger than the first stage. Therefore, a self-biased cascode with transistor boosting is used in the second stage. The depicted boosting means is the preferred transistor sub circuit, corresponding to that of FIGS. 3c and 4b. This configuration balances all the gate-drain swings in the cascodes and allows the maximum supply voltage to be used.

The self-biased cascode power amplifier, therefore, does not require extra bond pads to provide either a short circuit at G2 through series LC-resonators or to apply a supply voltage to G2. The self-biased cascode configuration provides means to set gate-drain voltages at M1 and M2. The optimal condition is when both transistors experience the same maximum drain-gate voltage. This means a larger supply voltage can be used, resulting in a higher output power. As an example embodiment several 2.5V, 2.4 GHz self-biased cascode power amplifiers (Class A/B and also Class E, both single and differential) were simulated in a 0.25 µm CMOS process, and superlative results were achieved It was further found that the supply voltage could even be increased to 3V without any transistor experiencing a gate-drain voltage larger than 5V.

The architectures/design techniques of the present invention are in no way restricted to CMOS technology. They can also be applied in a plethora of other technologies, both now known and to be known in the future.

It is understood that while the foregoing describes the preferred embodiments of the invention, various other modifications and additions will be apparent to those of skill in the art, such as, for example, application of the techniques of the invention to other fabrication technologies, such as BiCMOS, GaAs MESFET and GaAs PHEMT processes. As well, different types of transistors or other components may be employed, and alterations to the circuit configuration may be made to suit particular design requirements.

What is claimed is:

1. A method of increasing a maximum useable supply voltage in a power amplifier circuit, comprising:
   utilizing a cascode configuration; and
   self-biasing said cascode configuration;
   where the cascode configuration is self biased by:
      coupling the gate of a common source transistor to a signal input, and
      coupling the gate of an other transistor to its own drain;
      where the gate of said other transistor is also capacitively coupled to ground;
      where a unidirectionally-conducting sub circuit is coupled between the drain of said other transistor and said gate of said other transistor; and
      where said unidirectionally-conductive sub circuit is a series connection of a resistor and one of a diode and a diode connected transistor.

2. The method of claim 1, where the gate of said other transistor is coupled to its drain via two resistors in series, with a third transistor connected such that it source is connected to the gate of said other transistor, its drain to the drain of said other transistor, and its gate between said two resistors in series.

3. A method of facilitating maximum signal swing in a cascode configuration amplifier circuit comprising:
   connecting a signal input to the gate of a transistor of the cascode configuration amplifier circuit; and
   self-biasing an other transistor such that its gate more closely follows the voltage of its drain on positive swing than on negative swing; where the other transistor's gate more closely follows the voltage of its drain on positive swing than on negative swing due to a resistor and a diode or a diode connected transistor being connected in series across the drain and gate of said other transistor.

4. An amplifier circuit, comprising a first MOSFET and a second MOSFET connected in series and coupled between a DC voltage source terminal and a common terminal, an RF input signal terminal being coupled to a gate electrode of said first MOSFET, and the gate of said second MOSFET connected between a first resistor and a capacitor connected in series between the drain of said second MOSFET and the source of said first MOSFET, where a series connection of a second resistor and one of a diode and a diode connected transistor are connected from the drain of said second MOSFET to the gate of said second MOSFET.

5. An amplifier circuit, comprising a first MOSFET and a second MOSFET connected in series and coupled between a DC voltage source terminal and a common terminal, an RF input signal terminal being coupled to a gate electrode of said first MOSFET, and the gate of said second MOSFET connected between the series connection of a first resistor and a second resistor, and a capacitor, all connected in series between the drain of said second MOSFET and the source of said first MOSFET, where a third MOSFET is connected such that the drain of said third MOSFET is connected to the drain of said second MOSFET, the source of said third MOSFET is connected to the gate of said second MOSFET, and the gate of said third MOSFET is connected between the series connection of said first resistor and said second resistor.

6. The amplifier circuit of any of claim 4 or 5, where a source electrode of said first MOSFET is connected to said common terminal by an inductor, and a drain electrode of said second MOSFET is coupled to said DC voltage source by an inductor.

7. The amplifier circuit of any of claim 4 or 5, where a gate electrode of said first MOSFET is coupled to said RF input signal terminal by a capacitor.

8. The amplifier circuit of any of claim 4 or 5, where the output of said amplifier circuit is coupled to a load by a matching circuit.

9. The amplifier circuit of any of claim 4 or 5, where said circuit is utilized twice as two sides of a differential amplifier circuit.

10. A differential amplifier of claim 9, used as a stage in a multistage amplifier.

* * * * *